United States Patent
Chayat et al.

(10) Patent No.: US 12,020,858 B2
(45) Date of Patent: Jun. 25, 2024

(54) LOSS COMPENSATION IN RADIO-FREQUENCY FILTERS

(71) Applicant: VAYYAR IMAGING LTD., Yehud (IL)

(72) Inventors: Naftali Chayat, Kfar Saba (IL); Reut Wizenberg, Tel Aviv (IL); Nadav Mazor, Givatayim (IL)

(73) Assignee: VAYYAR IMAGING LTD., Yehud (IL)

(*) Notice: Subject to any disclaimer, the term of this patent is extended or adjusted under 35 U.S.C. 154(b) by 135 days.

(21) Appl. No.: 17/356,603

(22) Filed: Jun. 24, 2021

(65) Prior Publication Data
US 2021/0383967 A1 Dec. 9, 2021

Related U.S. Application Data

(63) Continuation of application No. 16/153,874, filed on Oct. 8, 2018, now Pat. No. 11,069,476.

(51) Int. Cl.
*H01F 38/14* (2006.01)
*H01F 5/00* (2006.01)
(Continued)

(52) U.S. Cl.
CPC ............ *H01F 38/14* (2013.01); *H01F 5/003* (2013.01); *H01F 27/29* (2013.01); *H01L 23/66* (2013.01);
(Continued)

(58) Field of Classification Search
CPC .......... H01F 38/14; H01F 5/003; H01F 27/29; H01L 23/66; H01L 2223/6672; H05K 1/18; H05K 2201/1003
See application file for complete search history.

(56) References Cited

U.S. PATENT DOCUMENTS 4,027,295 A * 5/1977 Maegawa ............... H01F 13/00
                                                                 365/34
5,361,050 A * 11/1994 Einbinder ........... H01P 1/20381
                                                                 333/204
(Continued)

FOREIGN PATENT DOCUMENTS

CN       104682910 A  *  6/2015
CN       104682910 A     6/2015
(Continued)

OTHER PUBLICATIONS

"Electrically Small RF Coil Arrays for Medical & Wireless Power Applications" In 2013 IEEE MTT-S International Microwave Workshop Series on RF and Wireless Technologies for Biomedical and Healthcare Applications (IMWS-BIO) Dec. 9, 2013 (Year: 2013).*

(Continued)

*Primary Examiner* — Malcolm Barnes
(74) *Attorney, Agent, or Firm* — Mark S. Cohen; PEARL COHEN ZEDEK LATZER BARATZ LLP

(57) ABSTRACT

A Q-enhanced radio-frequency filter featuring loss-compensating circuits with values that can be controlled to optimize loss compensation. Instabilities are avoided by temporarily introducing a reflection at a port (such as via short-circuiting the port) and testing for the beginning of oscillations. Certain embodiments provide negative-resistance circuits for loss compensation, including cross-coupled transistor pairs and adjustable capacitance. Further embodiments provide loss-compensating RF filters with planar inductors, including overlapping planar inductors.

14 Claims, 10 Drawing Sheets

(51) Int. Cl.
 *H01F 27/29* (2006.01)
 *H01L 23/66* (2006.01)
 *H05K 1/03* (2006.01)
 *H05K 1/18* (2006.01)

(52) U.S. Cl.
 CPC ........ *H05K 1/18* (2013.01); *H01L 2223/6672* (2013.01); *H05K 2201/1003* (2013.01)

(56) References Cited

U.S. PATENT DOCUMENTS

| | | | |
|---|---|---|---|
| 6,114,925 A | 9/2000 | Lo et al. | |
| 6,762,655 B2 * | 7/2004 | Wichern | H03H 5/003 |
| | | | 333/175 |
| 7,023,316 B2 | 4/2006 | Ahn et al. | |
| 7,113,384 B2 * | 9/2006 | Swinbanks | H02K 11/0141 |
| | | | 361/146 |
| 8,576,026 B2 | 11/2013 | Liu et al. | |
| 10,985,724 B1 * | 4/2021 | Wang | H01F 27/2804 |
| 2005/0099260 A1 * | 5/2005 | Ahn | H01L 28/10 |
| | | | 257/E21.022 |
| 2006/0220737 A1 * | 10/2006 | Sanderson | H03B 5/1841 |
| | | | 336/200 |
| 2007/0018767 A1 * | 1/2007 | Gabara | H01F 17/0006 |
| | | | 336/200 |
| 2007/0052512 A1 * | 3/2007 | Jeon | H01F 21/12 |
| | | | 336/200 |
| 2007/0126505 A1 * | 6/2007 | Bockelman | H03K 17/6872 |
| | | | 330/252 |
| 2007/0126529 A1 | 6/2007 | Chen | |
| 2008/0150668 A1 * | 6/2008 | Gabara | G06F 1/10 |
| | | | 336/200 |
| 2009/0167455 A1 * | 7/2009 | Liu | H03H 7/42 |
| | | | 333/167 |
| 2010/0045398 A1 * | 2/2010 | Liu | H01F 17/0013 |
| | | | 333/25 |
| 2010/0060402 A1 * | 3/2010 | Chen | H03H 7/422 |
| | | | 336/200 |
| 2011/0037535 A1 | 2/2011 | Kitamura | |
| 2011/0241163 A1 * | 10/2011 | Liu | H03H 7/09 |
| | | | 257/532 |
| 2011/0241793 A1 * | 10/2011 | Frye | H01L 23/5227 |
| | | | 29/25.01 |
| 2013/0141187 A1 * | 6/2013 | Chuang | H03H 7/0161 |
| | | | 333/175 |
| 2013/0154765 A1 | 6/2013 | Chuang et al. | |
| 2013/0157587 A1 * | 6/2013 | Blanchet | H01L 27/01 |
| | | | 336/200 |
| 2014/0218120 A1 * | 8/2014 | Hekmat | H03B 27/00 |
| | | | 336/5 |
| 2015/0369886 A1 | 12/2015 | Menon et al. | |
| 2017/0093169 A1 * | 3/2017 | Keeling | H02J 50/12 |
| 2017/0187197 A1 * | 6/2017 | Tan | H02J 5/00 |
| 2017/0346444 A1 * | 11/2017 | Cho | H03L 7/099 |
| 2018/0062237 A1 * | 3/2018 | Oohashi | H03H 7/48 |
| 2018/0091000 A1 * | 3/2018 | Jol | H02J 50/402 |
| 2018/0145630 A1 * | 5/2018 | Zhang | H03B 5/1231 |
| 2019/0148047 A1 * | 5/2019 | Asano | H03H 7/1725 |
| | | | 331/177 R |
| 2020/0007080 A1 * | 1/2020 | Lin | H03B 5/1243 |
| 2021/0345370 A1 | 11/2021 | Lee | |

FOREIGN PATENT DOCUMENTS

| | | |
|---|---|---|
| WO | WO 2013/149995 A1 | 10/2013 |
| WO | WO 2016/069185 A1 | 5/2016 |
| WO | WO 2017/053017 A1 | 3/2017 |
| WO | WO 2017/116630 A1 | 7/2017 |
| WO | WO 2018/057328 | 3/2018 |

OTHER PUBLICATIONS

Mak et al. "Electrically small RF coil arrays for medical & wireless power applications" In 2013 IEEE MTT-S International Microwave Workshop Series on RF and Wireless Technologies for Biomedical and Healthcare Applications (IMWS-BIO) Dec. 9, 2013 (pp. 1-3). IEEE.

Mak et al. "RF coil arrays for MRI applications" In 2011 IEEE International Symposium on Antennas and Propagation (APSURSI) Jul. 3, 2011 (pp. 1719-1722). IEEE.

* cited by examiner

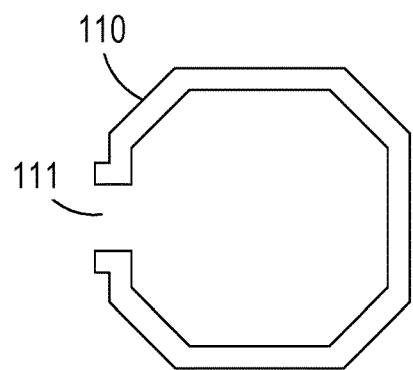
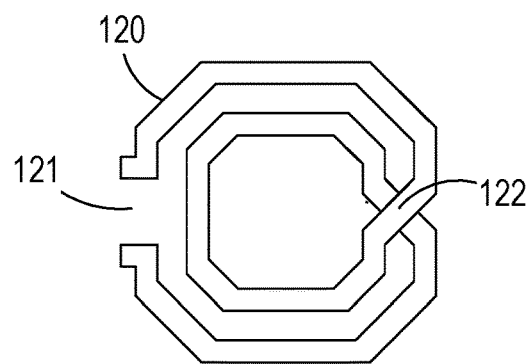
FIG. 1A     FIG. 1B
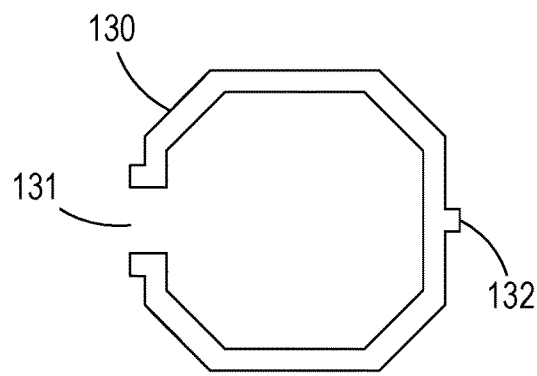
FIG. 1C
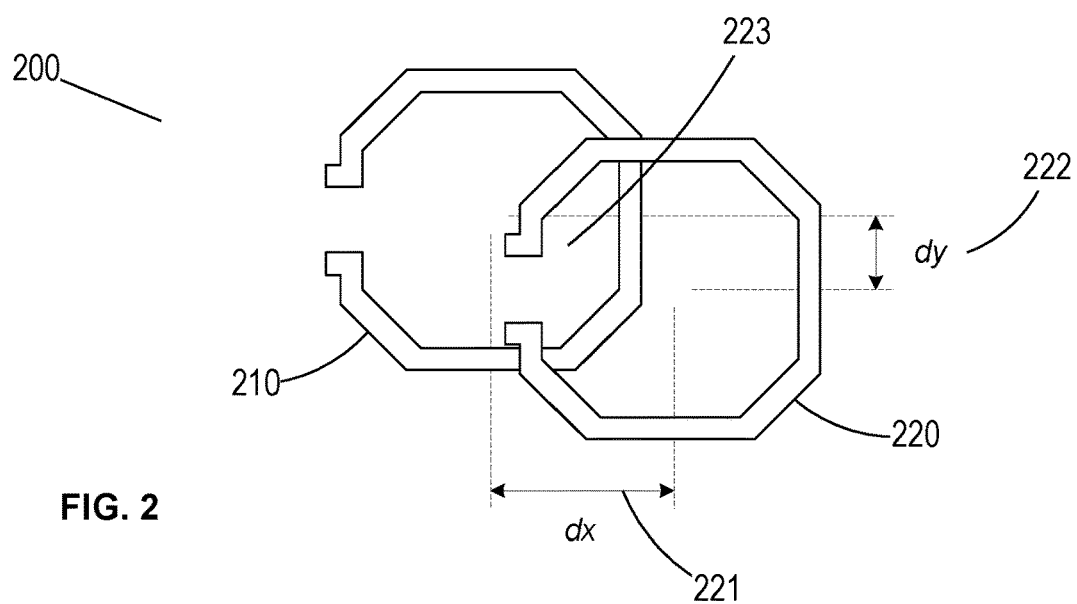
FIG. 2

LOSS COMPENSATION IN RADIO-FREQUENCY FILTERS

CROSS REFERENCE TO RELATED APPLICATION

This application is a Continuation of U.S. patent application Ser. No. 16/153,874, filed Oct. 8, 2018, entitled "Self-contained device with planar overlapping coils", and claims benefits therefrom including priority benefit.

FIELD

The present invention relates to radio-frequency (RF) filters, and in particular, to circuits and methods for reducing losses in RF filters.

BACKGROUND

Inductors and coupled inductors are used extensively in electronic circuits, especially at radio frequencies. Inductors are used in filters, matching networks, L-C resonators, etc. Coupled inductors are used in transformers, filters, directional couplers, and many other applications. Inductors are typically composed of coiled conductors, either single turn or multi-turn; at lower frequencies, the coils are augmented with magnetic cores to increase the inductance. At high frequencies, the inductance values become small enough to embed the inductors in planar structures, such as LTCC circuits or radio frequency integrated circuits (RFICs). The term "planar" with reference to coils herein denotes structures composed of nearby parallel planar conducting (metallic) layers, typically with separating dielectric layers, in which metallized holes (generally referred to as vias) can be formed to interconnect between different layers of metallization. When coil inductors (also denoted as "coils" in the context of the present invention) are formed using such planar technologies, metals in different layers can be interconnected to reduce resistance, or can be used to form conductively isolated crossings between conducting paths.

A changing electric current through a coil creates a changing magnetic field around the coil. By Faraday's law of induction, any change in magnetic flux through the coil area induces a voltage across it. Self inductance (also called inductance) is the ratio of an induced voltage with respect to the time rate of change of the current. When coils are located close together or overlap, the magnetic field created by the current in one passes through the other, thereby inductively coupling the coils, whereby a change in current in one coil causes the magnetic flux through the other circuit to vary, which induce a voltage in the other coil, by Faraday's law. The ratio of the voltage induced in the second coil to the rate of change of current in the first circuit is called the mutual inductance, between the coils The self-inductance of a planar coil depends primarily on its area, number of turns and its shape. Whenever there are two coils, there is a mutual inductance. The mutual inductance $M_{ij}$ between coil i and coil j can be expressed in terms of a "coupling coefficient" $k_{ij}$ such that $M_{ij}=k_{ij}\sqrt{(L_i L_j)}$ where $L_i$ and $L_j$ are the self-inductances of coil i and coil j respectively. The coupling coefficient relates to the fraction of the magnetic flux generated by one coil that passes through the second coil. The coupling coefficient can assume both positive and negative values, depending on the direction of the magnetic flux. In the case of similarly shaped planar coils, the coupling coefficient is maximal when the coils fully overlap, and it falls off as the coils are separated further apart. A combination of coils is described by its inductance matrix, with the self-inductances on the diagonal and the mutual inductances being the off-diagonal terms. The inductance matrix is symmetric, and is always positive-definite (from energy conservation considerations). Similarly, the coupling coefficient matrix (with 1's on the diagonal and coupling coefficients off-diagonal) is always positive definite.

SUMMARY

The term "self-contained", in the context of a device having planar overlapping coils as disclosed herein for embodiments of the present invention, denotes that the electromagnetic energy of the coils arises substantially only from the coils themselves and substantially affects only the coils themselves. That is, the device containing the planar overlapping coils does not interact via electromagnetic fields with any external device or with any external electromagnetic fields. Non-limiting uses of embodiments of the present invention include use as a component in an electronic circuit; in this non-limiting capacity, the component is also self-contained and does not interact via electromagnetic fields with any external device or with any external electromagnetic fields, as is the case, for example, in Wireless Power Transfer (WPT) systems and in receiver arrays of Magnetic Resonance Imaging (MRI) systems.

Various embodiments of the present invention provide compact (space-saving) arrangements of overlapping planar coils with prescribed coupling coefficients for RF use. Such arrangements of multiple overlapping planar coil inductors are applicable to numerous types of circuits, non-limiting examples of which include: filters (bandpass, low pass, etc.); baluns; transformers; matching networks; amplifier stages; distributed amplifiers; and frequency multipliers. Planar arrangements according to embodiments of the present invention are applicable to a variety of technologies, including, but not limited to: integrated circuits (IC, ASIC, RFIC), ceramic multilayer technologies such as low temperature co-fired ceramics (LTCC), and printed circuit boards (PCB).

According to various embodiments of the present invention, as coil inductors are moved apart, their coupling coefficient starts out at a maximum value $k_{max}$ ($\approx 1$) when the coils are concentric; the coupling coefficient reaches a zero value when the coils are still partially overlapping; and then, as the coils continue to be moved apart, the coupling coefficient becomes negative and reaches a minimum; and as the coils become distant from each other the coupling coefficient vanishes to zero. This behavior is exemplified in FIG. 3. Thus, a zero coupling coefficient is achieved with coils at a specific partially-overlapping position, as well as when the coils are far apart.

In many cases it is desirable to have a low level of coupling between coils, to avoid signal feedthrough, to avoid undesired feedback, and so forth. A common practice in such case is to keep the coils far apart. Another practice is to use "figure 8"-shaped coils, in which the fields of the two parts of the coil cancel out at distance. In certain embodiments of the invention, the coupling-versus-overlap behavior described above provides zero coupling at a specific partial overlap position. Exact nulling of the coupling may be sensitive to tolerances and to the prediction accuracy of the simulation tools used. However, within these tolerances, the overlapping arrangement of coils saves substantial amount of space.

In various embodiments of the present invention, there are at least three overlapping coils, such that for at least one triplet of coils, there are three pairs of overlapping coils. In certain embodiments, the three overlapping pairs are displaced in two orthogonal planar directions, such as in the "trefoil" configuration discussed below.

The above-presented coupling principles work similarly for three coils, all of which have weak coupling to each other. Rather than keeping the coils away from each other to keep the coupling weak, the three coils are set in a "trefoil" arrangement (e.g. FIG. 9B) in which each coil overlaps with both other coils. By controlling the amount of overlap in both x-direction and y-direction for each pair of coils (pairs 1-2, 2-3, and 1-3), this embodiment of the invention provides a space-saving network of three coils.

The underlying principle can be further applied to situations in which controlled coupling is exercised for coil inductor pairs 1-2 and 2-3, while keeping the coupling between coil of pair 1-3 small. Such a situation is typical of a planar bandpass filter with three L-C resonators, in which consecutive resonators are coupled by the coupling of respective adjacent coil inductors (e.g. of pairs 1-2 and 2-3), while non-adjacent resonators (e.g. of pair 1-3) have negligible coupling. On the other hand, by introducing intentionally-weak coupling between non-adjacent coils 1 and 3 (by increased or decreased overlap to control the sign of the coupling coefficient), a "transmission zero" can be introduced either above or below the filter passband.

The principle described above extends, to a certain degree, to four coupled coil inductors. Typically, it is desired to control coupling coefficients $k_{12}$, $k_{23}$ and $k_{34}$, (where $k_{ij}$ stands for coupling between coil i and coil j) while keeping coupling coefficients $k_{13}$, $k_{24}$ and $k_{14}$ close to zero. In the case where same-sized coils are used, the arrangement shown in FIG. 10A can be used to make $k_{13}$ and $k_{24}$ vanish, while still having some non-zero coupling $k_{14}$ arising from the distance between coils 1 and 4 (in FIG. 10A these are denoted as coil 1001 and coil 1004, respectively). There are certain degrees of freedom that can be invoked, such as the choice of the signs of the coupling, which may be immaterial in some cases. For example, if $k_{13}=k_{24}=k_{14}=0$, then filters with couplings $(k_{12}, k_{23}, k_{34})$, $(-k_{12}, k_{23}, -k_{34})$ and $(-k_{12}, -k_{23}, -k_{34})$ have the same frequency response, up to output polarity. Another example is that if $k_{13}=k_{24}=0$, but $k_{14}$ is not zero, then filters with couplings $(k_{12}, k_{23}, k_{34})$ and $(-k_{12}, k_{23}, -k_{34})$ have the same frequency response. These degrees of freedom are instrumental in adding transmission zeros to the filter frequency response.

According to certain embodiments of the present invention, the coils have the same size and shape; this has the advantage of better prediction accuracy, in that the coils will have same properties. Other embodiments, however, provide coils with different sizes and/or different shapes; this affords additional degrees of freedom in designing the coil arrangements.

In embodiments of the invention using circular coils, one parameter (distance between coil centers) is sufficient to describe the coupling coefficient. In other embodiments using more complex shapes (with predetermined orientations), a two-parameter function describes the dependence of the coupling coefficient on x-displacement and on y-displacement. The equal-coupling coefficient contours are useful in such case for positioning sets of coils relative to each other.

According to various embodiments of the invention, a compact (space-saving) form factor is provided by utilizing the coupling vs. displacement (overlap) function and making use of the observation that small/substantially zero coupling can be realized despite a significant overlap between coils.

Embodiments using three or four overlapping coils having both x- and y-displacements are disclosed. Varying/tuning the frequency as well as Q-enhancing techniques of L-C resonators implemented by planar coil inductors of this invention are also disclosed.

The applications related to coil arrangements are mostly related to L-C resonant circuits as used in filters, amplifiers, frequency multipliers etc. Some applications are exemplified.

It is understood and appreciated that the applications of the coil arrangements according to embodiments of the present invention are not limited to the circuits exemplified in the description, or to the frequency bands used for illustrative purposes.

BRIEF DESCRIPTION OF THE DRAWINGS

The subject matter disclosed may best be understood by reference to the following detailed description when read with the accompanying drawings in which:

FIG. 1A is a plan view of a single-turn planar coil inductor.

FIG. 1B is a plan view of a two-turn balanced planar coil inductor.

FIG. 1C is a plan view of a planar coil inductor with a center tap.

FIG. 2 illustrates two coils displaced one with respect to the other in x and in y directions.

FIG. 9A shows the non-inline "trefoil" configuration according to an embodiment of the present invention, with the middle coil offset from the center and where offsets are in two directions—an x offset and a y offset; and FIGS. 9B and 9C show symmetrical configurations with all three coils overlapping.

Figure 3:
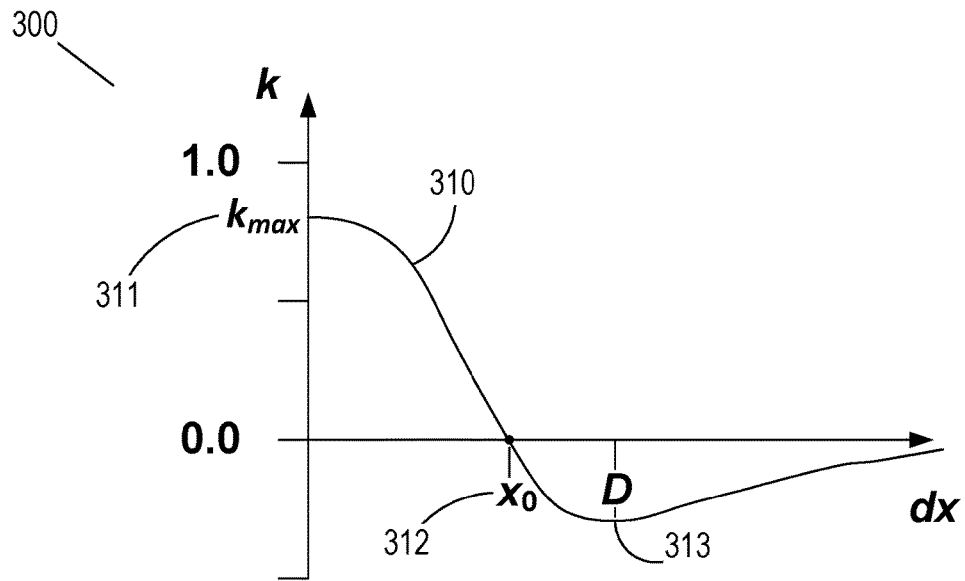
FIG. 3 illustrates an exemplary function of coupling coefficient between two overlapping coils versus coil displacement in one direction.

For simplicity and clarity of illustration, elements shown in the figures are not necessarily drawn to scale, and the dimensions of some elements may be exaggerated relative to other elements. In addition, reference numerals may be repeated among the figures to indicate corresponding or analogous elements.

DETAILED DESCRIPTION

FIG. 1 illustrates several possible planar inductor configurations. FIG. 1A shows a simple single-turn planar coil inductor 110. An opening 111 in the conductor is the location of the terminals where the signal is applied. The current in the conductor generates magnetic field, and the voltage induced on the coil is proportional to the time rate-of-change of the magnetic flux.

FIG. 1B shows a two-turn balanced planar coil inductor 120. In this case the conductor crosses over itself at a location 122, which is accomplished by using an additional metallization layer. An opening 121 in the conductor is the location of the terminals where the signal is applied.

FIG. 1C shows a single-turn differential planar coil inductor 130 having a center tap 132 opposite an opening 131 where the terminals are located. When a differential signal is applied to the terminals, the center tap enables connecting the coil to supply voltage without interacting with the signal, which has zero value at center tap 132.

FIG. 2 illustrates two coils 210 and 220 of similar size and shape and displaced one with respect to the other in x-direction 221 and in y-direction 222. This displacement forms an overlapping area 223. The coupling coefficient relates to the fraction of the magnetic flux generated by one coil that passes through the second coil and as such it is related to the displacement and to resulting overlapping area 223.

FIG. 3 is a plot 300 of an exemplary function 310 of the coupling coefficient k between two overlapping coils versus coil displacement in a one dimension (dx). As the coil inductors are separated, the coupling coefficient k starts at a maximum value $k_{max}$ 311 when the coils are concentric, i.e. fully overlapping; the coupling coefficient falls to zero at a displacement $x_0$ 312 with the coils still partially overlapping. Then, as dx continues to increase and the coils are further separated, the coupling coefficient becomes negative, reaching a minimum negative coupling at a displacement D 313. As dx grows very large and the coils eventually become distant from one another (and therefore no longer overlapping), the coupling again vanishes to zero. Thus, zero coupling coefficient is achieved with coils at a specific partially overlapping position ($x_0$), as well as when the coils are distant from one another.

Figure 4:
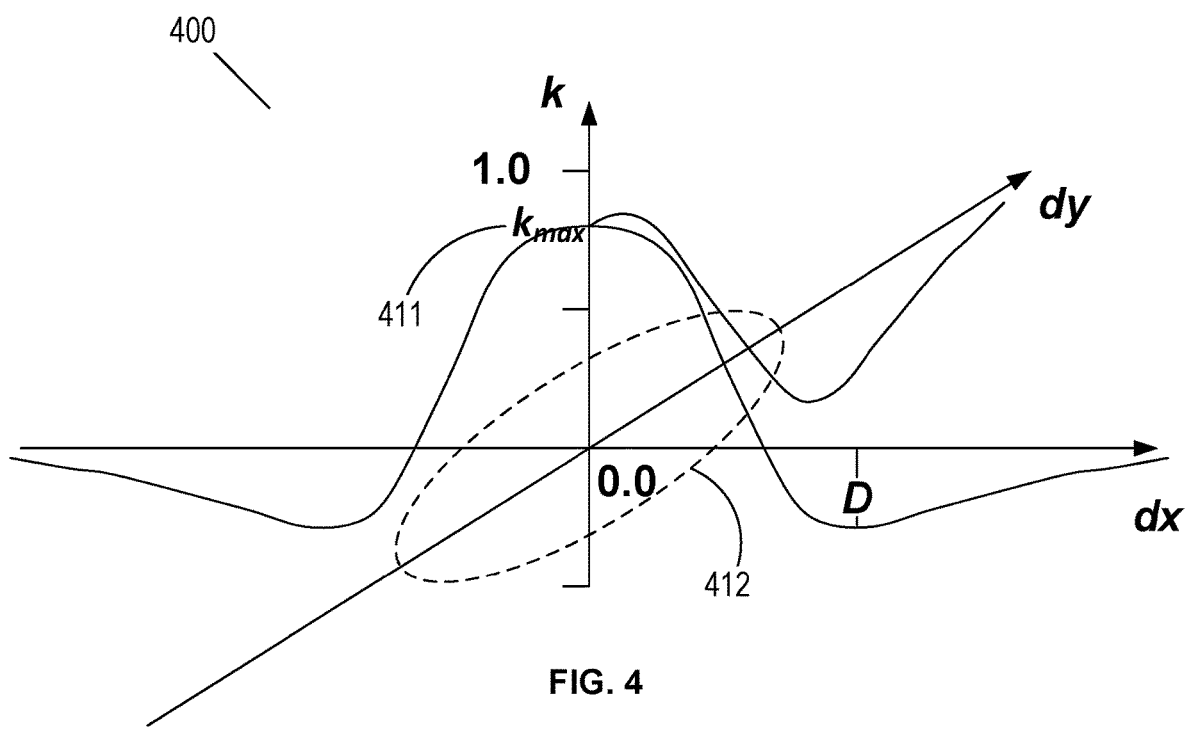
FIG. 4 illustrates an exemplary function of coupling coefficient between two overlapping coils versus coil displacement in two directions.
Figure 6:
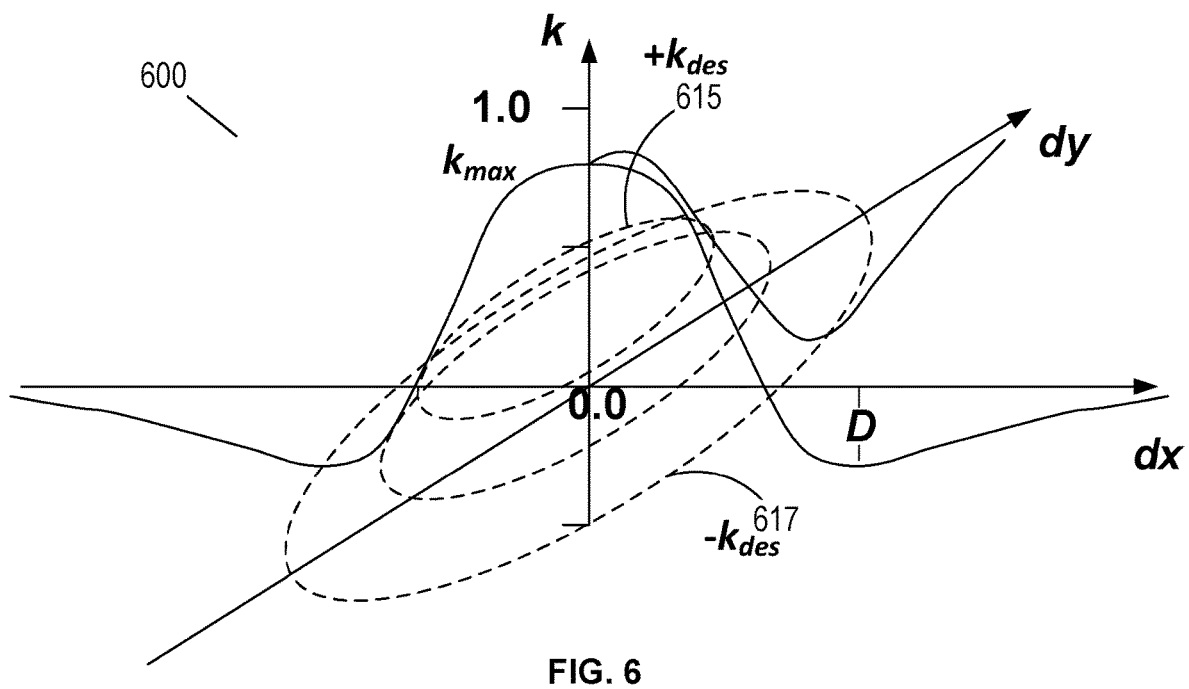
FIG. 6 illustrates coil displacement selection for achieving a given coupling coefficient for two overlapping coils, when displacement in both X and Y directions is allowed. Equal-coupling contours are illustrated.

FIG. 4 illustrates an exemplary 2-D function 400 of the coupling coefficient k between two overlapping coils versus coil displacement in two directions (dx and dy). As in the previous case of FIG. 3, the coupling coefficient k starts at a maximum peak value $k_{max}$ 411 and vanishes at large displacements in dx and/or dy. The coupling coefficient reaches a zero value on a (dx,dy) contour 412. For other values of a desired coupling coefficient, an equal-coupling contour of $+k_{des}$ 615 and equal coupling contours of $-k_{des}$ 617 are shown in FIG. 6. A two-parameter function describing the coupling coefficient dependence on x-displacement and on y-displacement is required when using coils of different sizes and/or asymmetrical shapes, thereby providing an additional degree of freedom in the design of coil arrangements. In these cases, equal-coupling coefficient contours as provided by this 2-D function are used for positioning sets of coils relative to one another.

Figure 5:
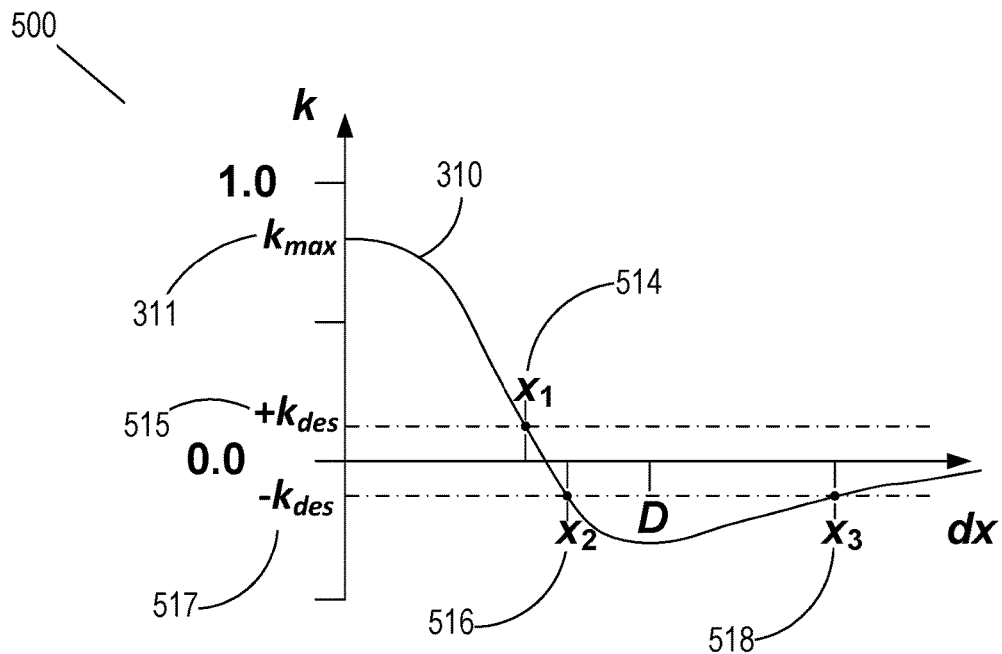
FIG. 5 illustrates coil displacement selection for achieving a given coupling coefficient for two overlapping coils, with coils displaced in a single direction.

FIG. 5 illustrates a coil displacement selection plot 500 for achieving a given coupling coefficient for two overlapping coils, with coils displaced in a single direction. A specific desired coupling coefficient $+k_{des}$ 515 is achieved at an overlapping displacement $x_1$ 514, while a value of $-k_{des}$ is achieved at displacements $x_2$ 516 and $x_3$ 518. As will be later shown, the coupling-versus-displacement dependence, together with the observation that zero coupling coefficient is achieved with coils at a specific partially overlapping position, enables overlapping arrangement of coils resulting in space-saving design of planar filters and other related circuits.

FIG. 6 illustrates an exemplary 2-D function 600 of the coupling coefficient k between two overlapping coils versus coil displacement in two directions (dx and dy), and has been previously discussed with respect to contour 615 of $+k_{des}$ and contour 617 of $-k_{des}$.

Figure 7A:
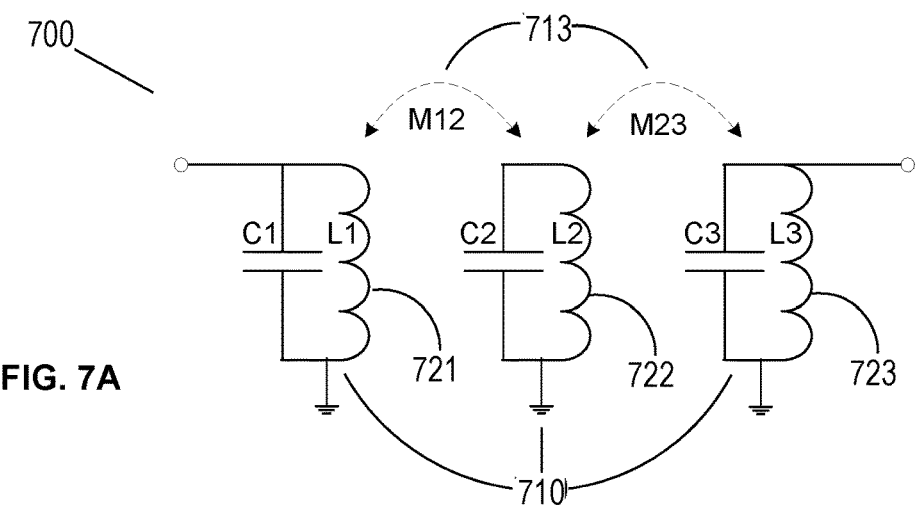
FIG. 7A schematically illustrates a bandpass filter containing three L-C resonators, coupled by the mutual inductance between adjacent inductors.

FIG. 7A schematically illustrates a typical bandpass filter 700 based on a cascade of L-C resonators 710 with controlled inductance coupling 713 between adjacent resonators. Typical currently-available implementations use a planar inline arrangement of coils 721, 722, and 723, with outermost resonators 721 and 723 being far from each other to achieve weak coupling.

Figure 7B:
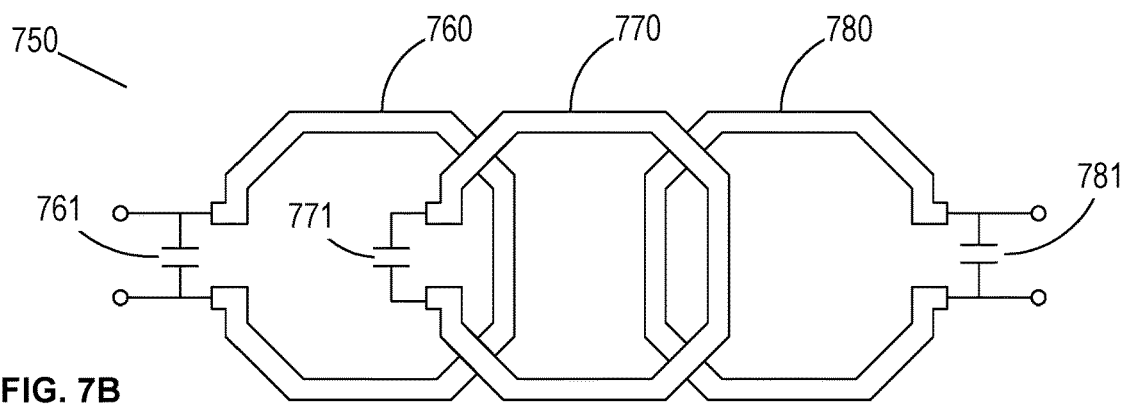
FIG. 7B illustrates a typical currently-available implementation of an inline three-coil bandpass filter, with outermost resonators being far from each other to achieve weak coupling.

FIG. 7B illustrates a common currently-available implementation 750 of the bandpass filter shown schematically in FIG. 7A. The L-C resonant circuits are implemented by inline coil inductors 760, 770, and 780 in parallel with capacitors 761, 771, and 781, respectively. Controlled inductance coupling is achieved by partial overlap of the coils. For example, leftmost coil 760 and center coil 770 are inductively coupled, as they share an overlapping area and the displacement between the coils is such that the required mutual inductance is achieved. The same holds for the coupling between center coil 770 and rightmost coil 780, while there is no overlap (and therefore very weak/negligible inductive coupling) between outermost coils 760 and 780.

Figure 8:
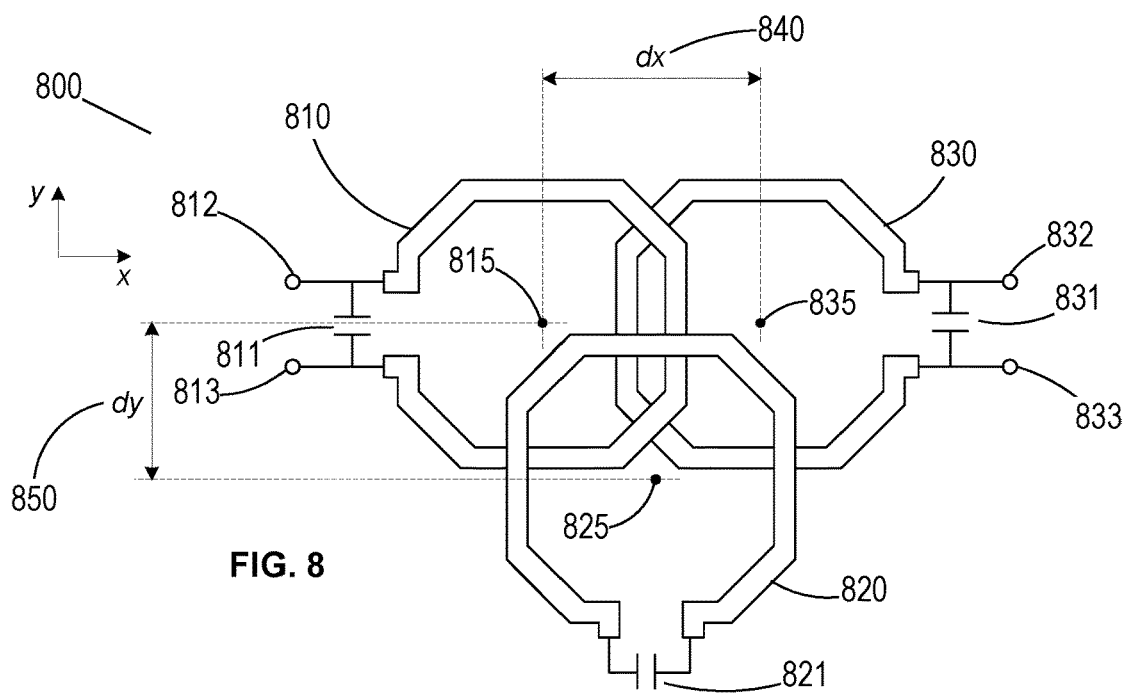
FIG. 8 illustrates a "trefoil" non-inline bandpass filter arrangement according to an embodiment of the present invention.

FIG. 8 illustrates a novel arrangement for a bandpass filter 800 according to an embodiment of the present invention, in contrast to the inline arrangement of bandpass filter 750 (FIG. 7B). In this embodiment, three coils 810, 820, and 830 are in a "trefoil" arrangement with all three overlapping, that is, three pairs of overlapping coils: 810-820, 820-830, and 810-830. By controlling the amount of overlap in both x-direction and y-direction for each pair of coils, and by making use of the fact that zero/negligible coupling between two coil inductors can also be achieved at a specific overlap displacement (as discussed above and illustrated in FIG. 3), this embodiment provides an implementation which is more compact (i.e., smaller and space-saving) than currently-available filters, such as inline filter 750 (FIG. 7B). For example, a dx overlap 840 between leftmost coil 810 and rightmost coil 830 is chosen to achieve near-zero coupling 312 (FIG. 3). Coil 820 is placed in the middle in the x-direction, so that it overlaps symmetrically with coils 810 and 830. A dy overlap 850 is chosen to achieve a desired amount of mutual coupling between the coils of pair 810-820 and between the coils of pair 820-830. By selecting dx overlap 840 appropriately, there is substantially a zero coupling between the pair 810-830, whereas there is similar coupling between the coils of pair 810-820 and the coils of pair 820-830; a non-zero coupling is achieved by appropriately selecting a dy overlap 850. As before, resonators are formed by adding capacitors 811, 821, and 831 in parallel with coil inductors 810, 820, and 830, respectively.

In a related embodiment of the invention, the coupling between pair 810-830 is chosen to be non-zero. This is attained by increasing or decreasing dx overlap 840 appropriately as desired. Typically, this intentional coupling is smaller (weaker) than the coupling between the coils of the other two pairs. This may be done to introduce a "transmission zero" either above or below the filter passband.

Figure 9A:
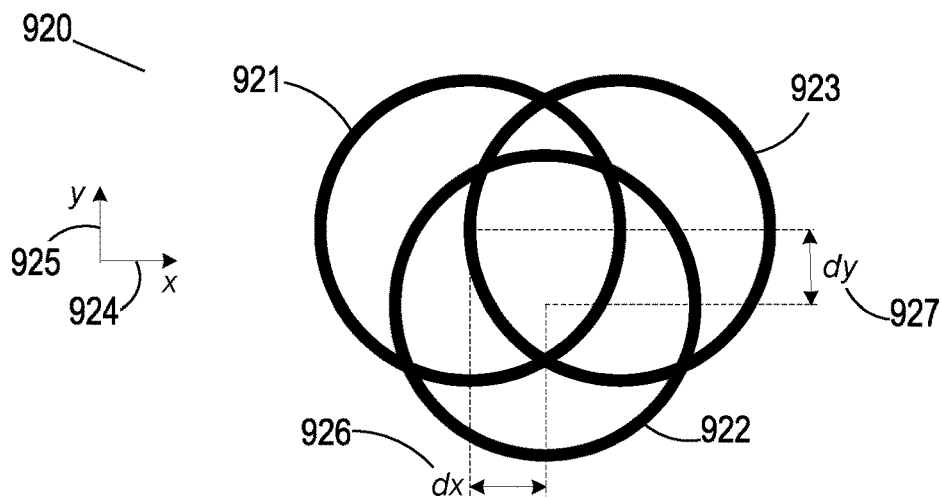
FIG. 9A, FIG. 9B, and FIG. 9C illustrate the geometries of several three-coil arrangements suitable for bandpass filters according to certain embodiments of the present invention.
Figure 9B:
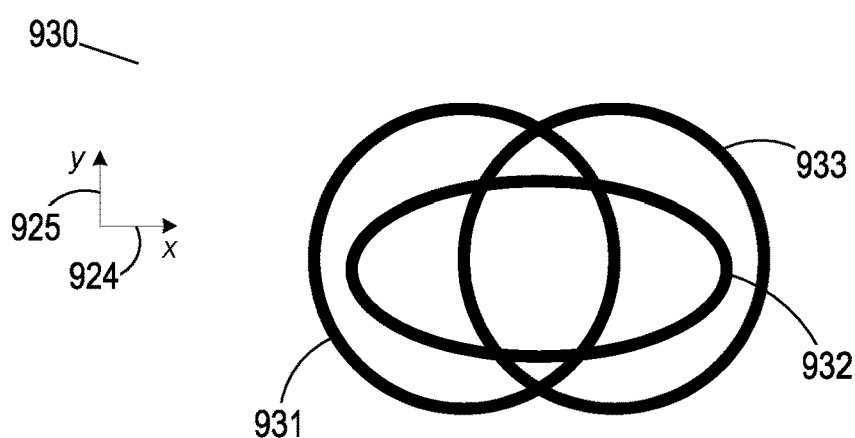
Figure 9C:
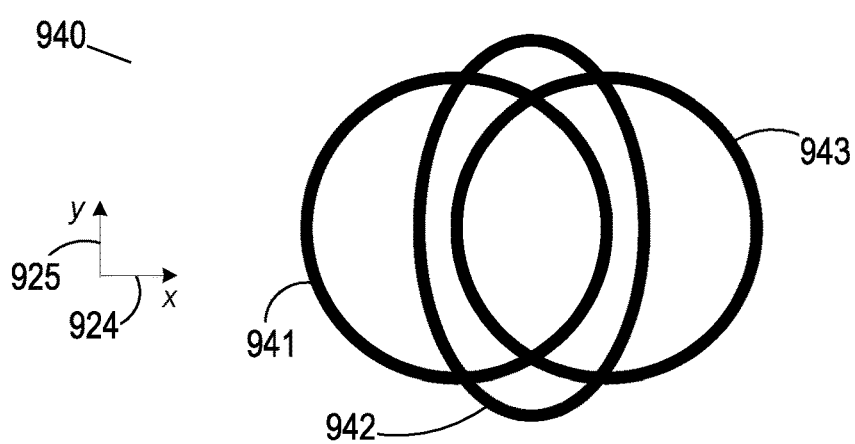

FIG. 9A, FIG. 9B, and FIG. 9C illustrate the geometries of several three-coil arrangements suitable for three L-C resonator bandpass filters, according to certain embodiments of the present invention.

FIG. 9A shows a trefoil configuration 920 with a center coil 922 staggered with respect to two other coils 921 and 923 via a symmetric dx overlap 926 and an asymmetric dy overlap 927, as discussed above and illustrated in FIG. 8. Trefoil configuration 920 is symmetric with respect to a y-axis 925, but is asymmetric with respect to an x-axis 924.

FIG. 9B shows a configuration 930 which is symmetric with respect to both x-axis 924 and y-axis 925, but where coils 931 and 933 have the same geometry, but a coil 932 has a different geometry. The differing geometry of coil 932 allows it to have the same non-zero coupling with both coil 931 and coil 933, while pair 931-933 are positioned with respect to one another to have substantially zero coupling, as described above and illustrated in FIG. 3. In a related embodiment, pair 931-933 has a non-zero coupling which is substantially less than the coupling of pair 931-932 and pair 932-933.

FIG. 9C shows a configuration 940 which is symmetric with respect to both x-axis 924 and y-axis 925, but where coils 941 and 943 have the same geometry, but a coil 942 has a different geometry. The differing geometry of coil 942 allows it to have the same non-zero coupling with both coil 941 and coil 943, while pair 941-943 are positioned with respect to one another to have substantially zero coupling, as described above and illustrated in FIG. 3. In a related embodiment, pair 941-943 has a non-zero coupling which is substantially less than the coupling of pair 941-942 and pair 942-943.

For the embodiments shown in FIGS. 9B and 9C, coils 932 and 942 have a different aspect ratio from that of coils 931, 933 and 941, 943, respectively, the difference between configuration 930 and configuration 940 being the horizontal-vertical orientation of the differing aspect ratios. In such configurations, by controlling the shape and the size of the different coil with respect to the similar coils, the desired coupling can be achieved. This arrangement also provides a more compact (space-saving) format in comparison with trefoil configuration 920. As noted, in related embodiments of the invention, the similar coils (931 and 933; 941 and 943) are intentionally coupled to have a weak coupling, substantially smaller than between the coils of the other pairs). It is noted that these examples are non-limiting, and other embodiments feature other geometrical differences to achieve similar results.

Figure 10A:
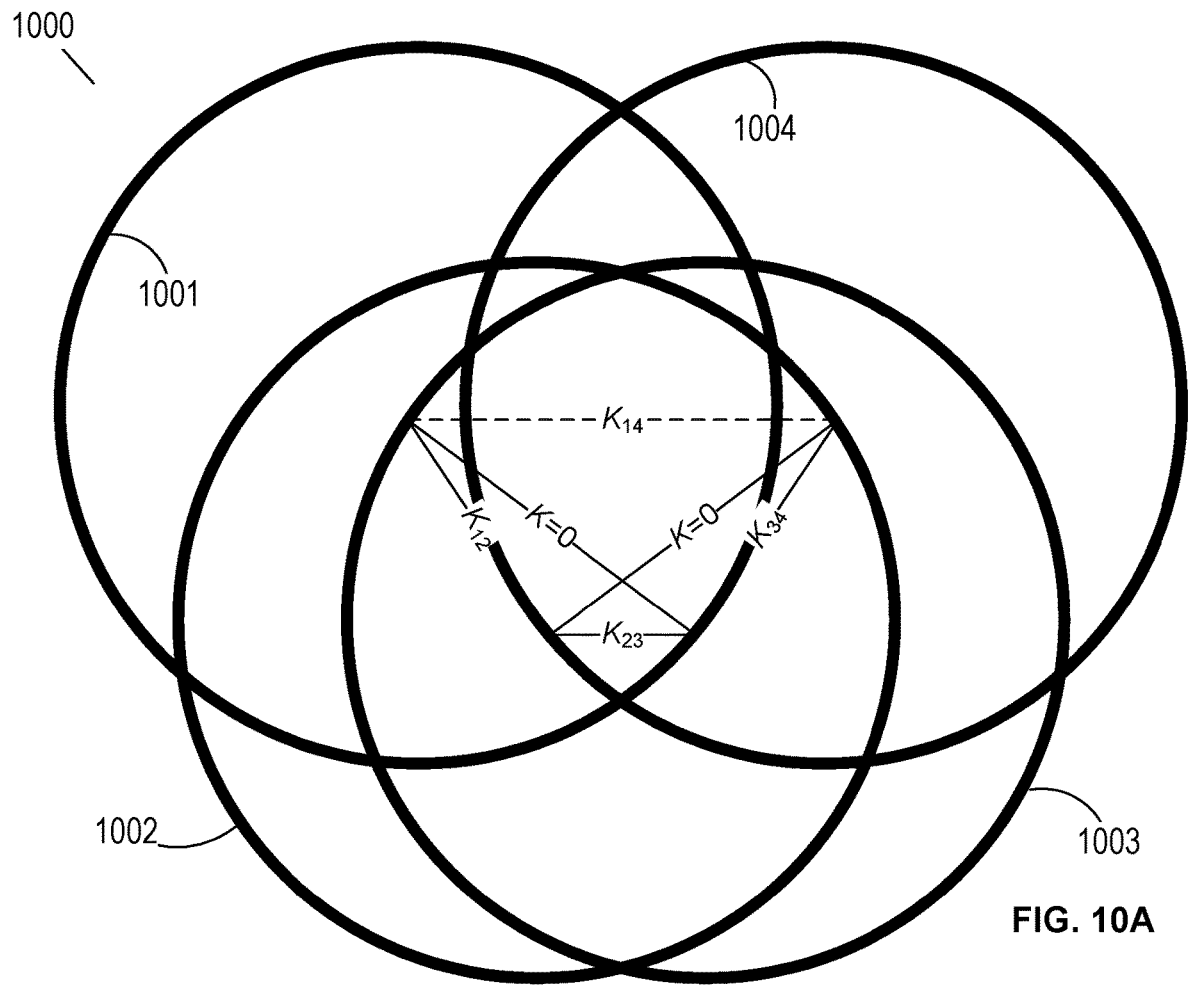
FIG. 10A illustrates arrangements of 4 coils, designed for low coupling between non-adjacent resonant circuits.
Figure 10B:
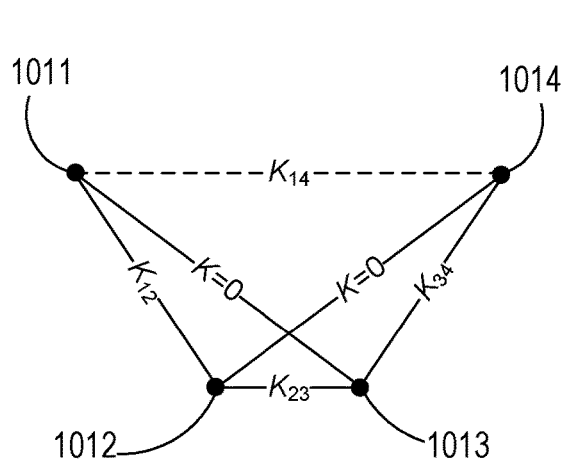
FIG. 10B schematically illustrates coupling constant relationships for the arrangement of FIG. 10A.
Figure 10C:
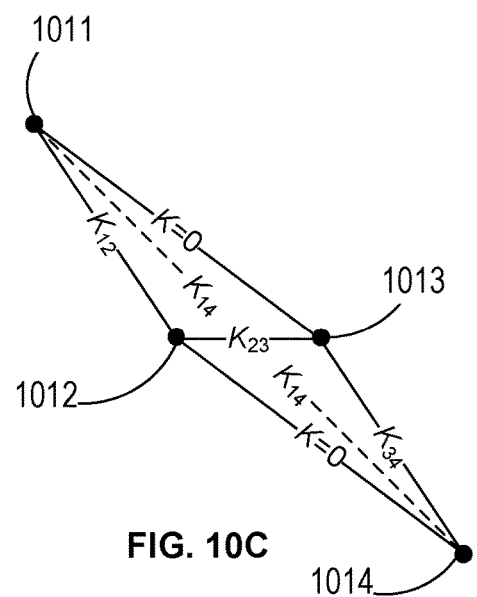
FIG. 10C schematically illustrates alternative coupling constant relationships for the arrangement of FIG. 10A.

FIG. 10A illustrates multiple overlapping coils 1000 for a larger number of coils, in one embodiment, an exemplary arrangement of 4 planar coils, designed for low coupling between non-adjacent resonators. FIG. 10B and FIG. 10C show embodiments of a schematic/geometrical method for determining such an arrangement. Denoting four coils 1001, 1002, 1003, and 1004 as '1', '2', '3' and '4' respectively, according to the embodiment they are treated as two triplets 1-2-3 and 2-3-4 wherein the coupling between coils 1 and 3 is either substantially zero or substantially smaller than the coupling between the pairs 1-2 and 2-3, and the coupling between coils 2 and 4 is either zero or substantially smaller than the coupling between the pairs 2-3 and 3-4. The required coil displacements are evaluated from an appropriate "coupling coefficient vs. displacement" function (e.g. 300 in FIG. 3). Then, for triplet 1-2-3 a triangle is formed, whose nodes are the coil centers and its edges are the distances between the centers (i.e., the displacements) 1-2, 1-3, and 2-3, resulting in the appropriate configuration for this triplet (that is, three coils positioned at displacements meeting the design coupling). Triplet 2-3-4 is handled in a similar way. Since both triplets share coils 2 and 3 the complete arrangement for the four coils is obtained, as illustrated in FIG. 10A, with the geometry of the combined triangles shown in FIG. 10B. In this configuration, all 4 coils are overlapping and the coupling between the outermost coils, such as pair 1-4 is evaluated as an outcome of the resulting distance 1-4. There is an alternate way to combine the two triangles, as shown in FIG. 10C, resulting in a different arrangement, with coils of pair 1-4 at a larger displacement.

The principles presented above also apply to embodiments having coils with more complex shapes, such as "figure-8" shaped coils. Once the shape defined, the coupling coefficient can be calculated versus x-y displacement, and this dependence can be used to design sets of coils by varying their relative displacements.

In certain embodiments of the invention, the planar coil inductors used in an L-C resonator are connected to tunable capacitors. Tuning/varying the capacitor values results in changing the resonant frequency. When the resonators are part of a bandpass filter, this change results in change of its center frequency.

Figure 11A:
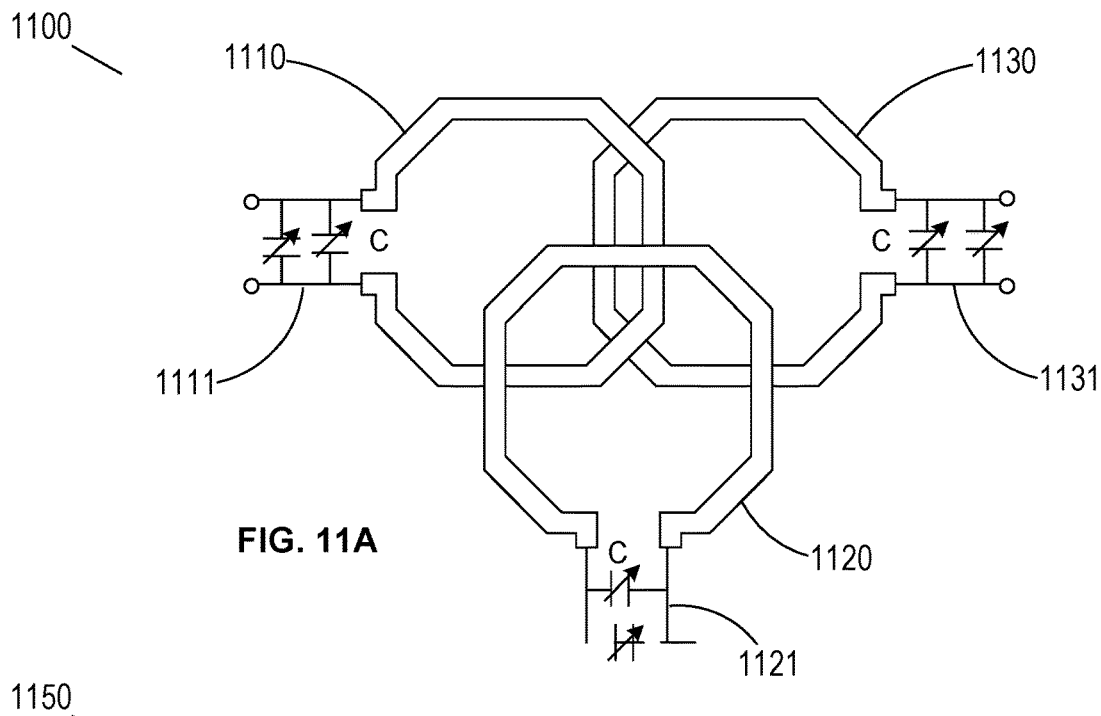
FIG. 11A illustrates a filter with frequency tuning using variable capacitors.
Figure 11B:
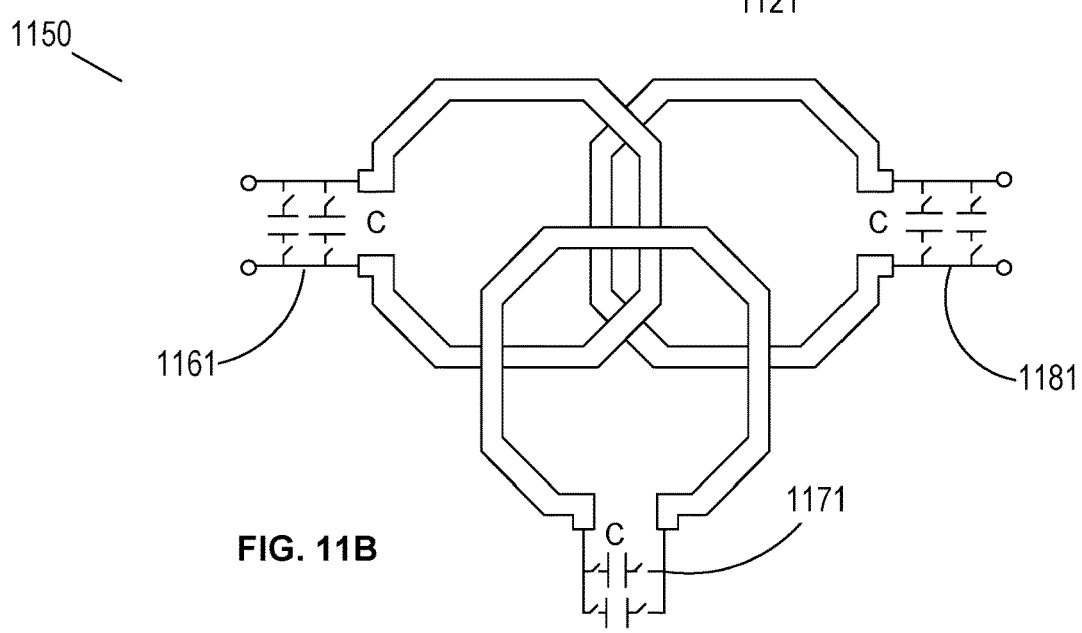
FIG. 11B illustrates a filter with frequency tuning using switched capacitors.
Figure 11C:
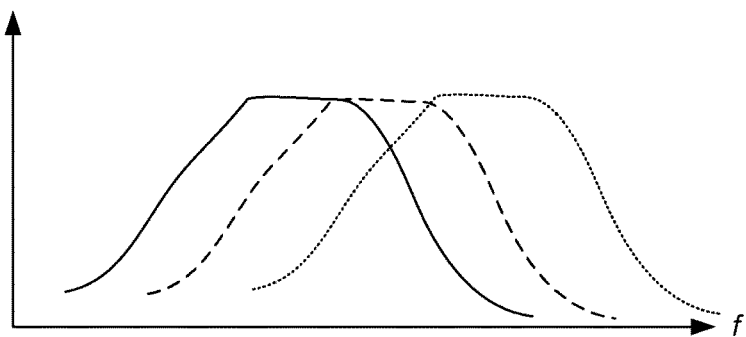
FIG. 11C illustrates the filter frequency response for several capacitance values.

In a related embodiment, as illustrated in FIG. 11A, capacitors 1111, 1121, and 1131 are voltage-controlled capacitors. In another related embodiment, as illustrated in FIG. 11B, capacitors 1161, 1171, and 1181 are switched capacitors. Changes in center frequency are illustrated in FIG. 11C.

Figure 12A:
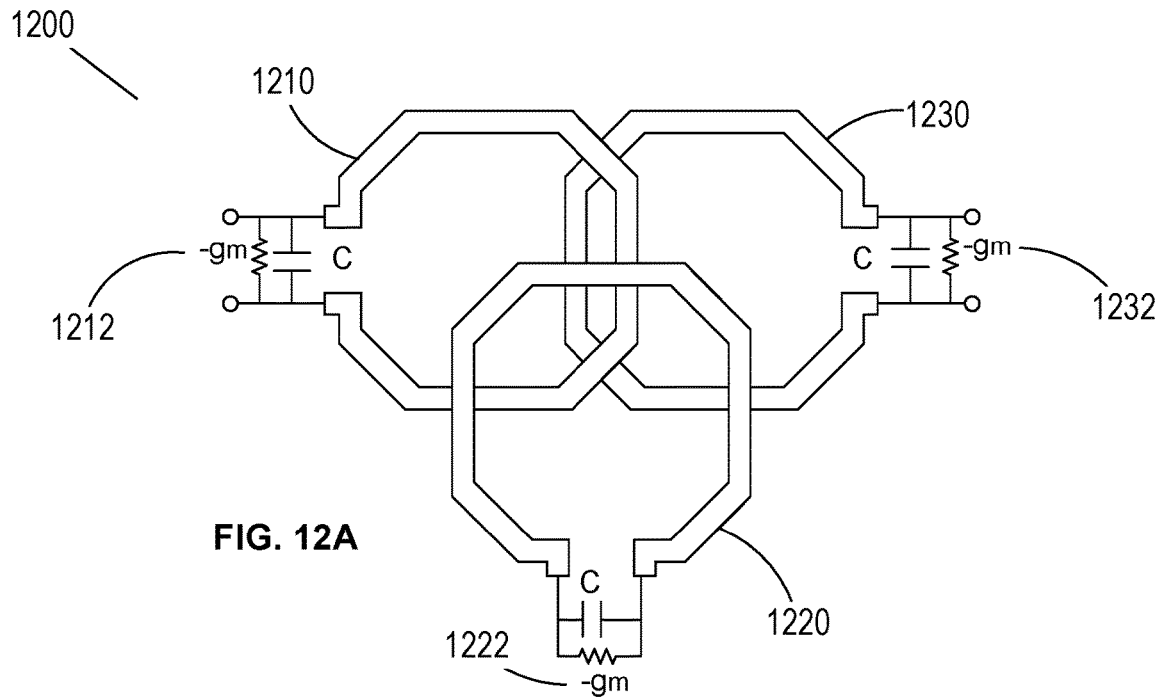
FIG. 12A illustrates a filter with Q-enhancement by adding negative resistances to the L-C resonant circuits.
Figure 12B:
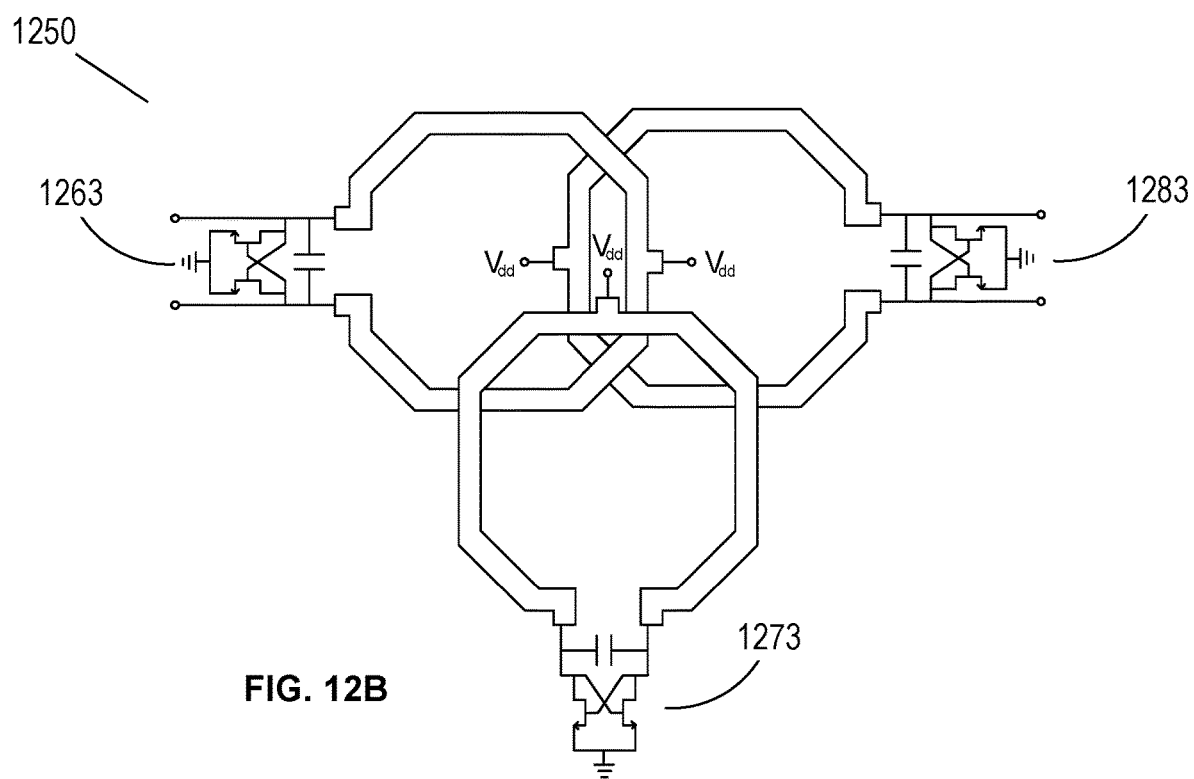
FIG. 12B shows an embodiment of Q-enhanced filter of FIG. 12A with negative resistance implemented by cross-coupled transistor pairs.

In certain embodiments of the invention, a negative resistance circuit is added in parallel to the coil inductor to counter the coil's resistive losses, thus enhancing its Q-factor. FIG. 12A illustrates a filter with Q-enhancement by adding negative resistances 1212, 1222, and 1232 to the L-C resonators. FIG. 12B shows an embodiment of Q-enhanced filter with the negative resistance implemented by cross-coupled transistor pairs 1263, 1273, and 1283.

Figure 13:
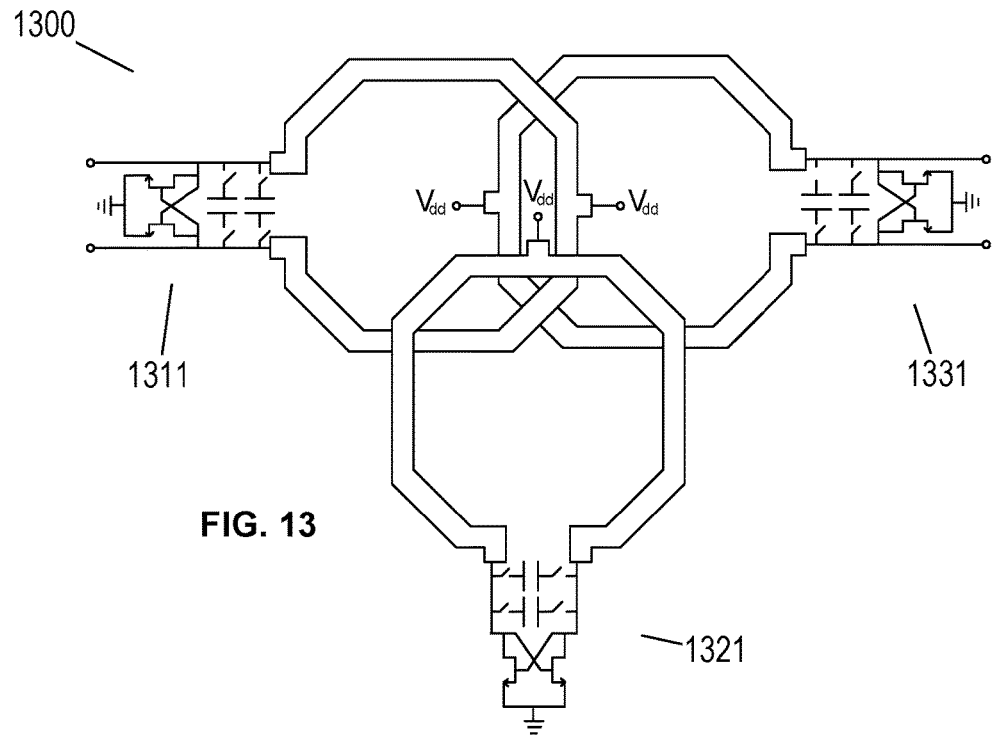
FIG. 13 illustrates an embodiment of a filter with frequency tuning using switched capacitors and Q-enhancement by cross-coupled transistor pairs.

FIG. 13 illustrates a further embodiment of the invention, in which a bandpass filter 1300 is tunable by using variable/ switched capacitors in combination with cross-coupled transistor pairs for Q-enhancement, 1311, 1321, and 1331.

A well-known issue with filters employing Q-enhancement techniques is the selection of the negative resistance value. Insufficient Q enhancement may result in inadequate Q-value, resulting in filter losses and inadequate filter selectivity. On the other hand, excessive compensation may result in stability issues in consequence of injecting energy into the resonant circuit. The losses in the inductors may vary over production spread, temperature, etc. Negative resistance of cross-coupled transistor pairs can be controlled via the transistor current, typically by a "tail transistor" (not shown).

Figure 14:
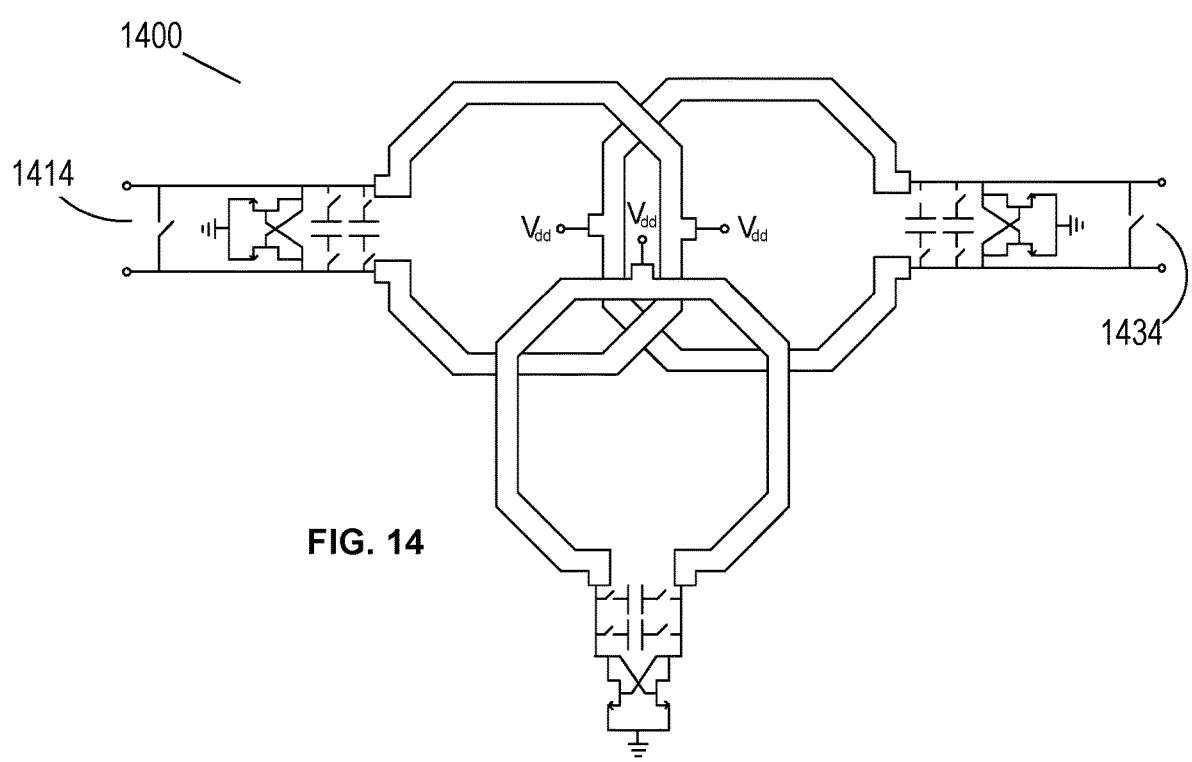
FIG. 14 illustrates an embodiment of a filter with frequency tuning using switched capacitors and Q-enhancement by cross-coupled transistor pairs with calibration switches.

However, it remains to select the proper control setting. FIG. 14 illustrates a configuration 1400 according to a related embodiment of the invention which provides switches 1414 and 1434 at the input and the output of the filter to short-circuit the filter ports and thereby introduce unity reflection coefficient at the filter ports. In normal operation the switches are open. In a calibration mode, however, switches 1414 and 1434 are closed to short the filter ports, and transistor conductance is increased until oscillations begin. This excitation of oscillations indicates that the filter gain has exceeded the insertion loss of 0 dB, and therefore that the coil losses are fully compensated. After the desired control value is determined and set, the switches are opened and the filter is restored to normal operation. This method of adjusting the value of the negative resistance is disclosed here in the context of filters based on overlapping coils, however this method may also be applied to other embodiments of Q-enhanced circuits.

Figure 15:
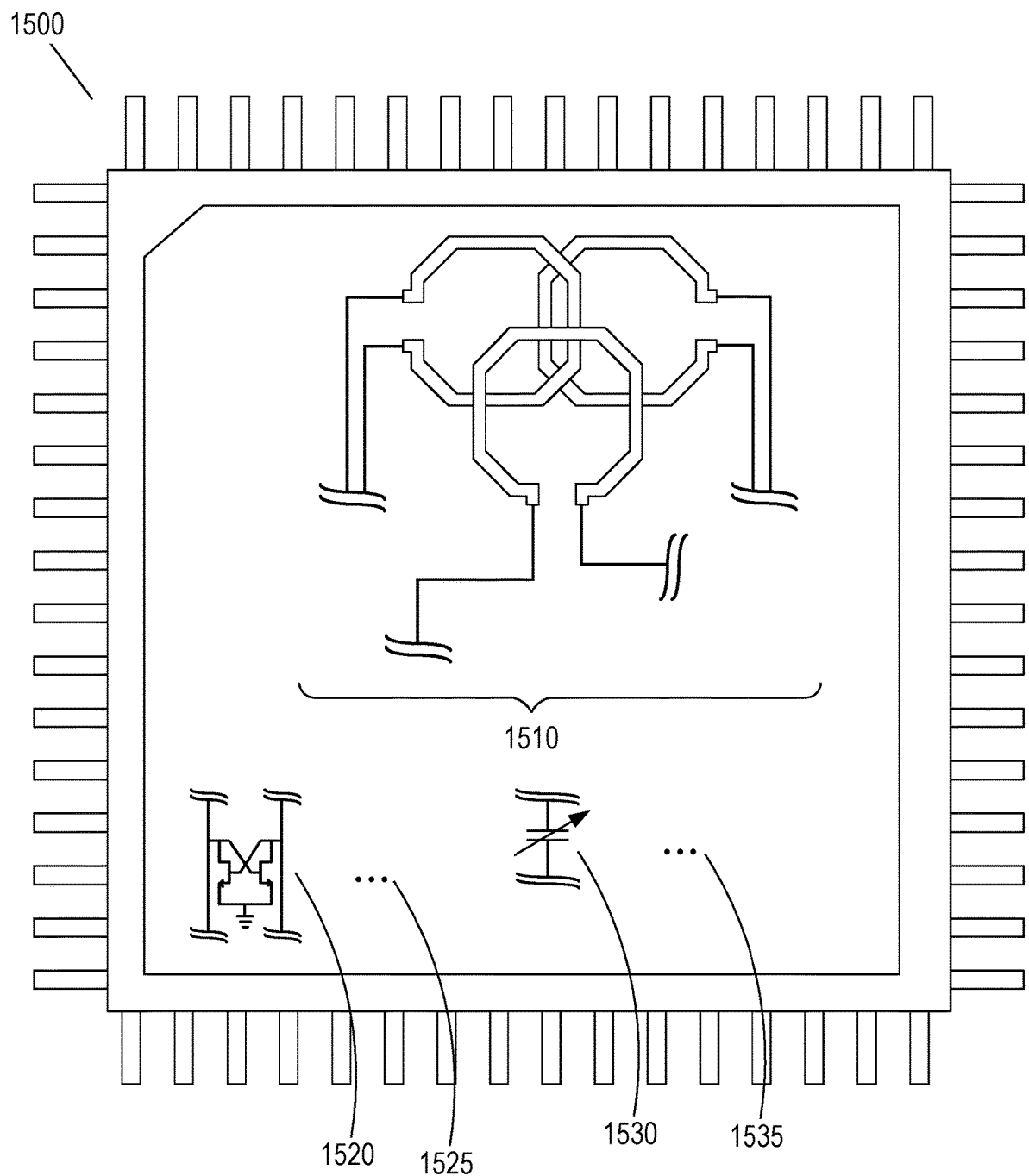
FIG. 15 conceptually illustrates a self-contained device according to an embodiment of the present invention, containing multiple planar overlapping coils as disclosed herein.

FIG. 15 conceptually illustrates a self-contained device 1500 according to an embodiment of the present invention, containing multiple planar overlapping coils 1510 as disclosed herein. In addition to coils 1510 in a related embodiment, device 1500 also contains at least one Q-enhancement component 1520 as disclosed above; with ellipsis 1525 indicating that more than one such component may be present. In a further embodiment, device 1500 also contains at least one capacitor, including but not limited to a variable capacitor 1530; with ellipsis 1535 indicating that more than one such capacitor may be present.

It is emphasized that, according to the various embodiments of the present invention as disclosed herein, device 1530 is self-contained with respect to the functioning of coils 1510. As previously noted, the electromagnetic energy of coils 1510 arises substantially only from coils 1510 themselves, and affects substantially only coils 1510 themselves. In particular, device 1530 does not interact via electromagnetic fields with any other device; it does not create or interact substantially with any external electromagnetic fields; nor does it substantially emit, receive, or interact with external electromagnetic waves, as is the case, for example, in Wireless Power Transfer (WPT) systems and in receiver arrays of Magnetic Resonance Imaging (MRI) systems.

If is further noted that embodiments of the current invention, as disclosed herein, are directed to space-saving configurations for complex combinations of coupling coefficients by offsetting coils with respect to each other, and the invention explicitly excludes the case of concentric coils for maximizing coupling, as is typically found in transformers and baluns.

APPLICATIONS

Embodiments of the present invention have numerous potential applications, in particular for design of high frequency circuits using multiple coupled coil inductors such as filters (bandpass, low pass, etc.), baluns, transformers, matching networks, amplifier stages, distributed amplifiers, frequency multipliers, and so forth. Embodiments of the invention provide compact, space-efficient devices which are implementable via a variety of technologies, including, but not limited to: integrated circuits (IC, ASIC, RFIC); ceramic multilayer technologies such as low temperature co-fired ceramics (LTCC); and printed circuit boards (PCB).

What is claimed is:

1. A Q-enhanced radio frequency (RF) filter comprising a plurality of loss compensating circuits,
   wherein respective loss compensating circuits have respective filter gains,
   wherein the RF filter includes a normal operation mode for filtering, and a calibration mode for setting a filter gain to compensate for filter losses,
   such that when the RF filter is in the calibration mode, the RF filter is operative:
      to introduce a unity reflection coefficient at at least one port of the RF filter;
      to increase the filter gain until an oscillation is excited; and
      upon excitation of the oscillation, to no longer introduce the unity reflection coefficient, and thereby restore the RF filter to be in the normal operation mode.

2. The RF filter of claim 1, wherein the filter is a bandpass filter.

3. The RF filter of claim 1, wherein the RF filter is operative to introduce the unity reflection coefficient at the at least one port by short-circuiting the at least one port.

4. The RF filter of claim 1, wherein a loss compensating circuit is a negative resistance circuit.

5. The RF filter of claim 4, wherein the negative resistance circuit includes a cross-coupled transistor pair.

6. The RF filter of claim 5, wherein controlling the negative resistance circuit comprises controlling a transistor current.

7. The RF filter of claim 1, wherein the filter comprises at least one inductor and at least one capacitor.

8. The RF filter of claim 7, wherein the at least one capacitor is tunable.

9. The RF filter of claim 8, wherein the at least one capacitor is tunable by a switch.

10. The RF filter of claim 8, wherein the at least one capacitor is a variable capacitor.

11. The RF filter of claim 10, wherein the variable capacitor is also tunable by a switch.

12. The RF filter of claim 7, wherein the at least one inductor is a planar inductor.

13. The RF filter of claim 7, wherein the filter comprises at least two inductors which are overlapping planar inductors.

14. The RF filter of claim 13, wherein the filter comprises at least three overlapping planar inductors having an overlap area common to all of the at least three overlapping planar inductors.

* * * * *